United States Patent
Kwak

(10) Patent No.: US 8,914,698 B2
(45) Date of Patent: Dec. 16, 2014

(54) CYCLIC REDUNDANCY CHECK CIRCUIT AND COMMUNICATION SYSTEM HAVING THE SAME FOR MULTI-CHANNEL COMMUNICATION

(75) Inventor: Jae-Young Kwak, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 787 days.

(21) Appl. No.: 13/017,701

(22) Filed: Jan. 31, 2011

(65) Prior Publication Data

US 2011/0161789 A1    Jun. 30, 2011

Related U.S. Application Data

(63) Continuation of application No. 11/376,278, filed on Mar. 15, 2006, now Pat. No. 7,890,835.

(30) Foreign Application Priority Data

Sep. 12, 2005    (KR) .................. 10-2005-0084550

(51) Int. Cl.
| | |
|---|---|
| *H03M 13/00* | (2006.01) |
| *H04L 1/00* | (2006.01) |
| *H04N 19/42* | (2014.01) |
| *H04L 25/14* | (2006.01) |

(52) U.S. Cl.
CPC ........ *H04N 19/00478* (2013.01); *H04L 1/0045* (2013.01); *H04L 25/14* (2013.01); *H04L 1/0061* (2013.01); *H04L 1/0041* (2013.01); *H04M 13/091* (2013.01)
USPC ............................ 714/758; 714/746; 714/786

(58) Field of Classification Search
CPC ....................................................... H03M 13/09
USPC .................... 714/758, 746, 776, 757, 786
See application file for complete search history.

(56) References Cited

U.S. PATENT DOCUMENTS

| | | | | |
|---|---|---|---|---|
| 5,465,260 A | * | 11/1995 | Zook ............................ | 714/758 |
| 6,519,738 B1 | * | 2/2003 | Derby ........................... | 714/781 |

* cited by examiner

*Primary Examiner* — Fritz Alphonse
(74) *Attorney, Agent, or Firm* — F. Chau & Associates, LLC

(57) ABSTRACT

A method of implementing and manufacturing a cyclic redundancy check circuit for a multi-channel communication system. The method includes creating a generation expression that generates cyclic redundancy check (CRC) bits that satisfies a cyclic redundancy check polynomial of a mono-channel serial communication system with respect to a first point in time, creating a generation expression with respect to points in time that are sequentially delayed as much as the number of multi-channels from the first point in time by applying each point in time to the generation expression, and embodying a circuit corresponding to the generation expression with respect to the most delayed point in time among the created generation expressions. The CRC circuit corresponding to the generation expression will have more modulo-2 adders (e.g., XOR gates) than the number of non-zero coefficients in the selected CRC polynomial.

31 Claims, 3 Drawing Sheets

CYCLIC REDUNDANCY CHECK CIRCUIT AND COMMUNICATION SYSTEM HAVING THE SAME FOR MULTI-CHANNEL COMMUNICATION

CROSS-REFERENCE TO RELATED PATENT APPLICATIONS

This application is a Continuation of U.S. application Ser. No. 11/376,278 filed on Mar. 15, 2006 now U.S. Pat. No. 7,890,835, which claims priority to Korean Patent Application No. 10-2005-0084550, filed on Sep. 12, 2005, in the Korean Intellectual Property Office, which is incorporated herein in its entirety by reference.

BACKGROUND OF THE INVENTION

1. Field of the Invention

The present invention relates to a cyclic redundancy check (CRC) circuit and a communication system having the same, and more particularly, to a cyclic redundancy check (CRC) circuit and a communication system having the same in a multi-channel serial communication system such as a high definition multimedia interface (HDMI).

2. Description of the Related Art

HDMI is a cable and interface for transmitting uncompressed digital audio and video data between an audio/video source such as a set-top box (e.g., a cable box, of a satellite receiver) or a DVD player and a display such as a digital TV. HDMI supports standard high definition video and multi-channel audio and all ATSC (advanced television systems committee) HDTV standards and 8 channel digital audio, through a single cable and only one connector at each end (a mini-plug with 19-poles). HDMI transfers audio data frequencies up to 192 kHz with a word width up to 24 bit on up to 8 channels. The band width for video data is at up to 165 MHz. Therefore it is possible to transmit all picture and sound formats of the home cinema world—including HDTV (up to the highest resolution of 1080 p)—without any loss of quality.

The Cyclic Redundancy Check is a way to detecting small changes in blocks of transmitted data and was originally developed for detection of line transmission errors. CRC (cyclic redundancy check) is an error detection method to certify reliability of transmitted/received data in serial data transmission systems and the principles of its operation are as follows. First, when a word of n-bit data is shifted by k bits and the k-shifted n-bit data is divided by a predetermined (preset) k-bit key (polynomial) value, an r-bit remainder is left. At a transmission end (of the serial data transmission system), the r-bit remainder is appended to the original n-bits, to produce (n+r) bits of data that is transmitted. At a receiving end (of the serial data transmission system), the (n+r) bits of received data is divided by the key value and, if the remainder is 0, it is determined that the received data has no error.

The CRC algorithm operates on a block or frame of data as a unit (e.g., a single large numerical value). The CRC algorithm divides this large value by a predetermined number (the CRC polynomial or generator polynomial P), leaving the remainder, which is the r-bit CRC result. The CRC result can be sent or stored along with the original data. When the data is received (or recovered from storage) the CRC algorithm can be reapplied, and the latest result compared to the original result. If an error has occurred, there will probably be a different CRC result. Most uses of CRC do not attempt to classify or locate the error (or errors), but simply arrange to repeat the data operation until no errors are detected.

The quality of generated r-bit CRC as the reminder after division is mainly influenced by the chosen generator polynomial. The selection of generator polynomial is the most important part of implementing the CRC algorithm. The polynomial is chosen to maximize the error detecting capabilities. When creating a new polynomial, general advice is to use an irreducible polynomial (over modular arithmetics), which means that the polynomial cannot be divided by any polynomial (except itself) with zero remainder. The specific CRC is defined by the polynomial P used. A degree-k polynomial, has the form $1+x+x^k$. This is naturally expressed as an k+1 bit string, but the highest ($x^k$) term is normally implicit, leaving a k-bit string.

The CRC polynomial expression P(x) defined by the HDMI standard has an order (k) of eight, and is shown below in Equation 1.

$$P(x)=1+x^6++x^7+x^8 \quad \text{[Equation 1]}$$

The process of generating the r CRC bits according to the HDMI CRC polynomial expression of Equation 1 is described below.

FIG. 2 is a block diagram of a conventional CRC circuit configured to implement the CRC polynomial expression of Equation 1. The CRC circuit of FIG. 2 is configured for processing serial data transmitted and received through a general mono-channel serial communication system. The symbol ⊕ represents an XOR gate or modulo-2 adder. The CRC circuit includes a plurality (r, up to or equal to, but not more than, the order k of the polynomial) of modulo-2 adders 41 and a plurality (k, e.g., k=8 for HDMI) of flip-flops 42 for delaying the input data. The r bits of the CRC output by the circuit of FIG. 2 correspond to r taps P[0], P[5], and P[6].

CRCs are based on division of polynomials over integers modulo-2. In this modular arithmetic, coefficients of polynomials are represented by only one bit. Any string of bits can be interpreted as a sequence of polynomial coefficients. The CRC algorithm treats all bit streams as binary polynomials. Any string of bits (data) can be interpreted as the coefficients of a polynomial of this sort, and to find the CRC, we divide the data by another fixed polynomial P. This pre-defined polynomial is called the devisor or CRC Polynomial. The coefficients of the remainder polynomial are the CRC. The CRC is defined as a sequence of coefficients appearing in the remainder polynomial.

Modulo-2 arithmetic allows an efficient implementation of a form of division that is fast, easy to implement, and sufficient for the purposes of error detection. Addition and subtraction operations are equivalent in modulo-2 arithmetic and both are the same as the XOR (Exclusive OR) function for bits, so it's very simple to implement in hardware. There are no carries between the bits and computing of all basic operations is less computational expensive than in normal arithmetic. That is the reason why the modular arithmetic is used.

A summary of the CRC creation process is as follows:
1. Get the n-bit data.
2. Left shift the n-bit data (by k bits) and the divide it by P.
3. The r-bit reminder of the last action is the CRC.
4. Append the first r-bit CRC to the data and transmit them together as a data frame.

And a summary of the CRC check process is as follows:
1. Receive the data frame.
2. Divide it (e.g., the n bits of data) by P.
3. Compare the second r-bit CRC with the transmitted first r-bit CRC.

The conventional hardware CRC implementation (circuit) is shown in FIG. 2. Thus, the shift register of FIG. 2 (comprised of k flip flops 42) contains k bits, equal to the length (order) of the Polynomial (Equation 1). In the conventional CRC circuit, there are up to k (but no more than k) XOR gates. The presence or absence of an XOR gate corresponds to the presence or absence of a term in the divisor polynomial P.

A CRC circuit that is identical to the CRC circuit at the transmission end is provided at the receiving end. The CRC circuit at the receiving end generates r CRC bits from the n-bits of transmitted/received data and determines the existence of an error by comparing the r generated CRC bits and the r received (e.g., transmitted) CRC bits.

In a mono-channel serial communication system, such as a universal serial bus (USB), CRC bits are instantly generated when the transmission of serial data is completed real time. However, in a multi-channel serial communication system such as HDMI, since multiple data are transmitted simultaneously in parallel through multiple channels, there is a need to generate CRC bits suitable for the multi-channel transmission.

SUMMARY OF THE INVENTION

While the conventional CRC circuit includes only r modulo-2 adders (corresponding to the r bits of the CRC, where r is up to or equal to, but not more than, the order k of the polynomial) the CRC circuits according to various embodiments of the invention include more than r modulo-2 adders.

An aspect of the present invention provides a cyclic redundancy check (CRC) circuit that can process data in parallel in a multi-channel serial communication. Another aspect of the present invention provides a (multi-channel) communication system having the cyclic redundancy check (CRC) circuit.

According to an aspect of the present invention, a cyclic redundancy check circuit for multi-channel serial communication is manufactured according to a method comprising: creating a first generation expression that generates cyclic redundancy check bits and that satisfies a cyclic redundancy check polynomial of a mono-channel serial communication system with respect to a first point in time, creating a second generation expression with respect to points in time that are sequentially delayed, by the number of multi-channels, from the first point in time (e.g., by substituting each point in time to the first generation expression), and embodying a circuit corresponding to the second generation expression.

According to another aspect of the present invention, a transmitting circuit comprises a plurality of storing units configured to store data that is input in parallel, a cyclic redundancy check circuit configured to receive data in parallel from the storing units and to generate cyclic redundancy check bits, and a transmission circuit configured to transmit the data in parallel from the storing units and the cyclic redundancy check bits through the multi-channel.

According to another aspect of the present invention, a receiving circuit comprises a plurality of storing units configured to store parallel data that is received with first cyclic redundancy check bits through a multi-channel, a cyclic redundancy check circuit configured to receiving the parallel data and to generate second cyclic redundancy check bits, and a determination portion configured to determine the detection of an error (e.g., an error generated in the multi channel) (e.g., by comparing the first cyclic redundancy check bits with the second cyclic redundancy check bits).

According to another aspect of the present invention, a communication system comprising a transmitter and a receiver. The transmitter includes a plurality of first storing units configured to store data that in parallel, a first cyclic redundancy check circuit configured to input data in parallel from the storing units and to generate first cyclic redundancy check bits from the parallel data, a transmission circuit configured to transmit data in parallel from the storing units through a multi-channel and, when the data is transmitted, to transmit the first cyclic redundancy check bits through the multi-channel. The receiver includes a plurality of second storing units configured to store the parallel data that is received through the multi-channel, a second cyclic redundancy check circuit configured to receive the parallel data and to generate second cyclic redundancy check bits from (based on) the parallel data; and a determination portion configured to determine the detection of an error (e.g., an error generated in the multi channel), e.g., by comparing the first cyclic redundancy check bits with the second cyclic redundancy check bits.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF EXEMPLARY EMBODIMENTS OF THE INVENTION

Figure 1:
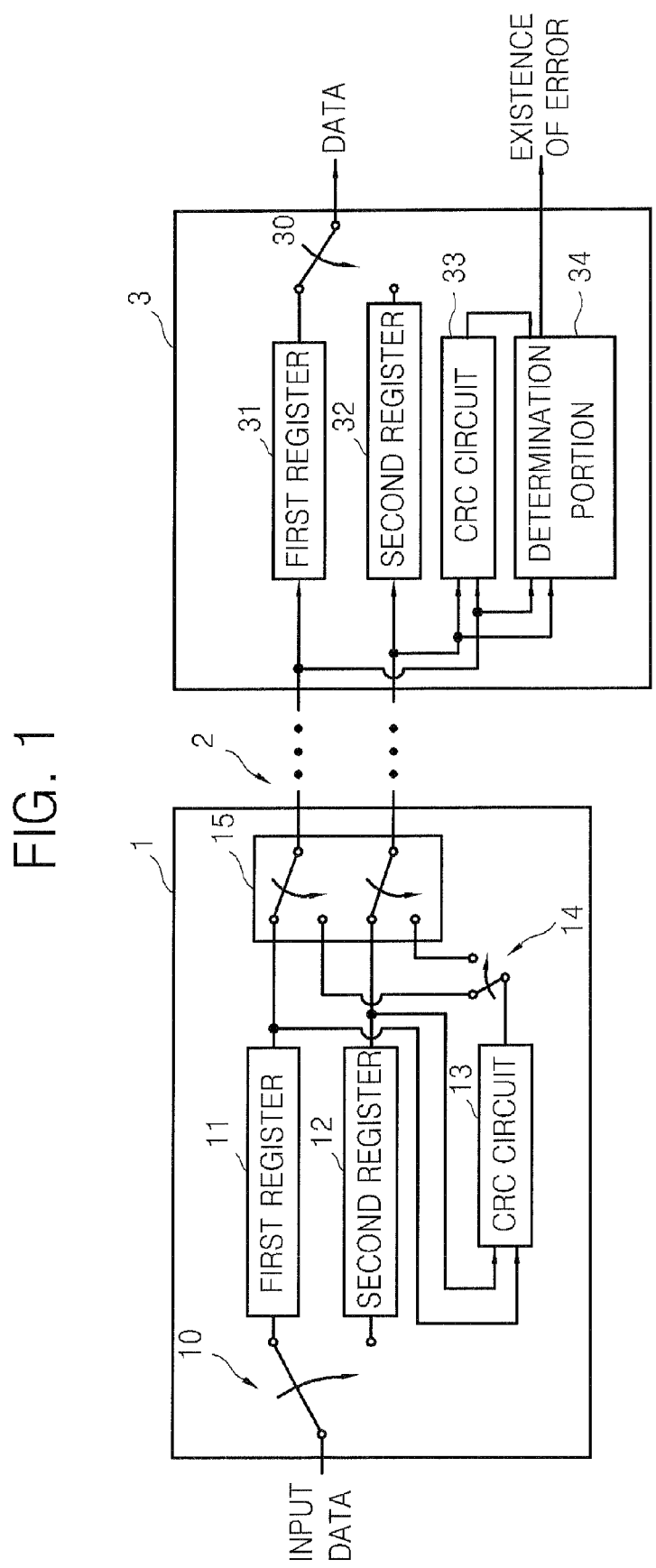
FIG. 1 is a block diagram of a communication system that transmits through multiple channels including a cyclic redundancy check circuit according to an embodiment of the present invention.

FIG. 1 is a block diagram of a communication system that communicates (transmits and receives) through a multi-channel (through multiples channels) including a cyclic redundancy check circuit according to an embodiment of the present invention. The system of FIG. 1 includes a transmission circuit (transmitter) 1 and a receiving circuit (receiver) 3. The transmission circuit 1 transmits data to a receiving circuit 3 through a multi-channel 2. Although the multi-channel 2 has only two channels (for the convenience of simpler explanation), the present invention is not limited thereto and can be extended to any multiple number of channels.

The transmission circuit 1 includes a first register 11, a second register 12, a cyclic redundancy check (CRC) circuit 13, a switch 14, and a switching portion (multiplexer) 15. The transmission circuit 1 may further include a switch 10 to convert input serial data to parallel data. For the convenience of explanation, the switch 10 and the switch 14 are referred to a first switch and a second switch, respectively.

The first and second registers 11 and 12 store input data. When the input data is serial data, the first switch 10 stores the input data either in the first register 11 or in the second register 12 by switching the order of inputting the input data so as to make parallel transmission possible. The first and second registers 11 and 12 are shift registers that shift the stored data at every clock cycle. The data output from the first register 11 or from the second register 12 is transmitted to the receiving circuit 3 through the multiple channels of the multi-channel 2 in parallel.

The data output from the first register 11 or from the second register 12 is also output to the CRC circuit 13. The CRC circuit 13 generates CRC bits suitable for a communication (transmitting and receiving the received data) between the transmission circuit 1 and the receiving circuit 3. The CRC bits are transmitted through the second switch 14 in the same order as the data.

The switch portion (multiplexer) 15 connects the first and second registers 11 and 12 to the multi-channel 2 so that the data is transmitted in parallel. When the CRC bits are generated, the switch portion (multiplexer) 15 connects the output of the CRC circuit 13 (connected via the second switch 14), to the multi-channel 2.

The receiving circuit (receiver) 3 includes a first register 31, a second register 32, a CRC circuit 33, and a determination portion 34. The receiving circuit 3 may further include a switch 30 that converts the parallel data output from the first and second registers 31 and 32 into serial data. If necessary, the switch 30 converts the parallel data output from the first and second registers 31 and 32 to serial data and outputs the serial data.

The first and second registers 31 and 32 store the data received from the first and second channels, respectively, of the multi-channel 2. The first and second registers 31 and 32 are shift registers that sequentially shift input data and output the shifted data.

The CRC circuit 33 of the receiving circuit (receiver) 3 is the same as the CRC circuit 13 of the transmission circuit (transmitter) 1 and generates CRC bits from the transmitted (n+r) bit data received through the multi-channel 2. The determination portion 34 checks whether the r CRC bits received through the multi-channel 2 is identical to the r CRC bits generated by the CRC circuit 33. When the CRC bits are determined as identical, the determination portion 34 determines and outputs a signal indicating that no error exists.

Figure 2:
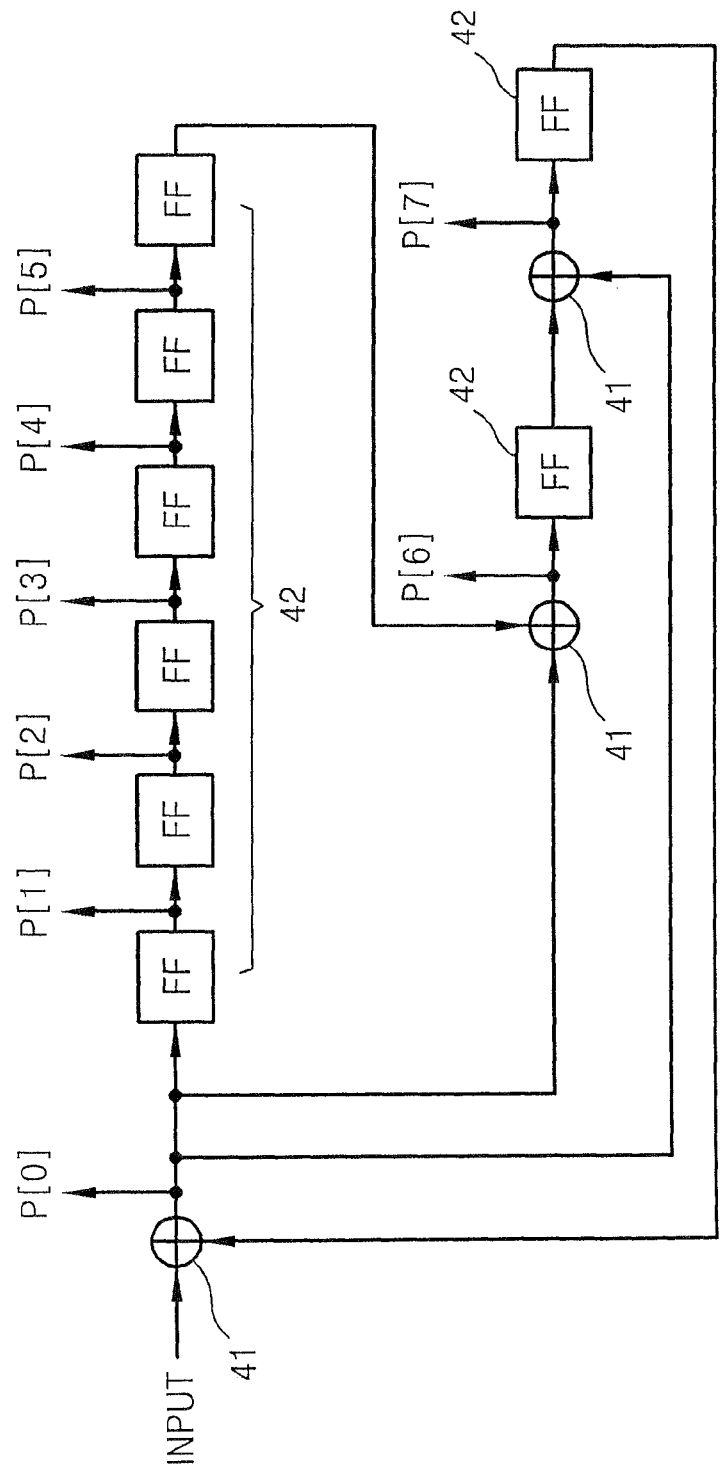
FIG. 2 is a circuit diagram of a conventional cyclic redundancy check circuit configured according to a cyclic redundancy check polynomial expression of a high definition multimedia interface (HDMI)

In the present embodiment, each of the CRC circuit 13 of the transmission circuit 1 and the CRC circuit 33 of the receiving circuit 3 generates r CRC bits according to a CRC polynomial expression of HDMI (Equation 1). The current output at the first tap of the conventional CRC circuit of FIG. 2 (expressed herein as $p[0](t)$) is equal to the current (time t) input (expressed here as Input(t)) plus the prior output of the last (eighth) tap (expressed here as $p[7](t-1)$). Thus, $p[0](t) = \text{Input}(t) \oplus p[7](t-1)$. The current (time t) output of each of the CRC circuit's other taps may be expressed in a similar fashion. Thus, a generation expression for generating each of the (final) CRC bits according to the above circuit of FIG. 2 at the current (t-th) clock cycle is shown in Equation 2 below:

$p[0](t) = \text{Input}(t) \oplus p[7](t-1)$ $p[1](t) = p[0](t-1)$ $p[2](t) = p[1](t-1)$ $p[3](t) = p[2](t-1)$ $p[4](t) = p[3](t-1)$ $p[5](t) = p[4](t-1)$ $p[6](t) = p[5](t-1) \oplus \text{Input}(t) \oplus p[7](t-1)$ $p[7](t) = p[6](t-1) \oplus \text{Input}(t) \oplus p[7](t-1)$ [Equation 2]

When final input data is input to the circuit, final CRC bits are generated according to Equation 2 and the r CRC bits generated at a transmission end are appended to n data bits and transmitted (in parallel) therewith.

In the present embodiment, since the transmission and receiving ends communicate with each other according to the HDMI standard, the data can be transmitted in parallel using two channels as shown in FIG. 1, and thus, 2 bits of data are transmitted in one clock cycle. Thus, there is a need to adapt the CRC circuit in the mono-channel serial communication system presumed in FIG. 2 to a multi-channel serial communication system.

To this end, in the present embodiment, the CRC bit generation expression of Equation 2 can be modified as follows. While the serial data is input one bit at a time, 2 bits of data are actually input in parallel at a single clock cycle in the parallel communication system such as HDMI.

The parallel input data maybe expressed as a sequence of data pairings, e.g., serial_in(t) and serial_in(t+1), according to the original (serial) order of the input data.

For example, when "0110" is input, at the first clock cycle, "0" and "1" are initially transmitted in parallel through the first and second channels respectively and, at the next clock cycle, "1" and "0" are transmitted in parallel through the first and second channels respectively. Thus, for the data input at the first clock cycle, "0" and "1" are respectively represented by serial_in(t) and serial_in(t+1), and when the new representation of input data is applied to Equation 2, the result is shown in Equation 3 below:

$p[0](t+1) = \text{serial\_in}(t) \oplus p[7](t)$ $p[1](t+1) = p[0](t)$ $p[2](t+1) = p[1](t)$ $p[3](t+1) = p[2](t)$ $p[4](t+1) = p[3](t)$ $p[5](t+1) = p[4](t)$ $p[6](t+1) = p[5](t) \oplus \text{serial\_in}(t+1) \oplus p[7](t)$ $p[7](t+1) = p[6](t) \oplus \text{serial\_in}(t+1) \oplus p[7](t)$ [Equation 3]

When Equation 2 is applied to Equation 3, the result is shown in Equation 4 below.

$p[0](t+1) = \text{serial\_in}(t+1) \oplus p[6](t-1) \oplus \text{serial\_in}(t) \oplus p[7](t-1)$ $p[1](t+1) = \text{serial\_}(t) \oplus p[7](t-1)$ $p[2](t+1) = p[0](t-1)$ $p[3](t+1) = p[1](t-1)$ $p[4](t+1) = p[2](t-1)$ $p[5](t+1) = p[3](t-1)$ $p[6](t+1) = p[4](t-1) \oplus \text{serial\_in}(t+1) \oplus p[6](t-1) \oplus \text{serial\_in}(t) \oplus p[7](t-1)$ $p[7](t+1) = p[5](t-1) \oplus \text{serial\_in}(t+1) \oplus p[6](t-1)$ [Equation 4]

Figure 3:
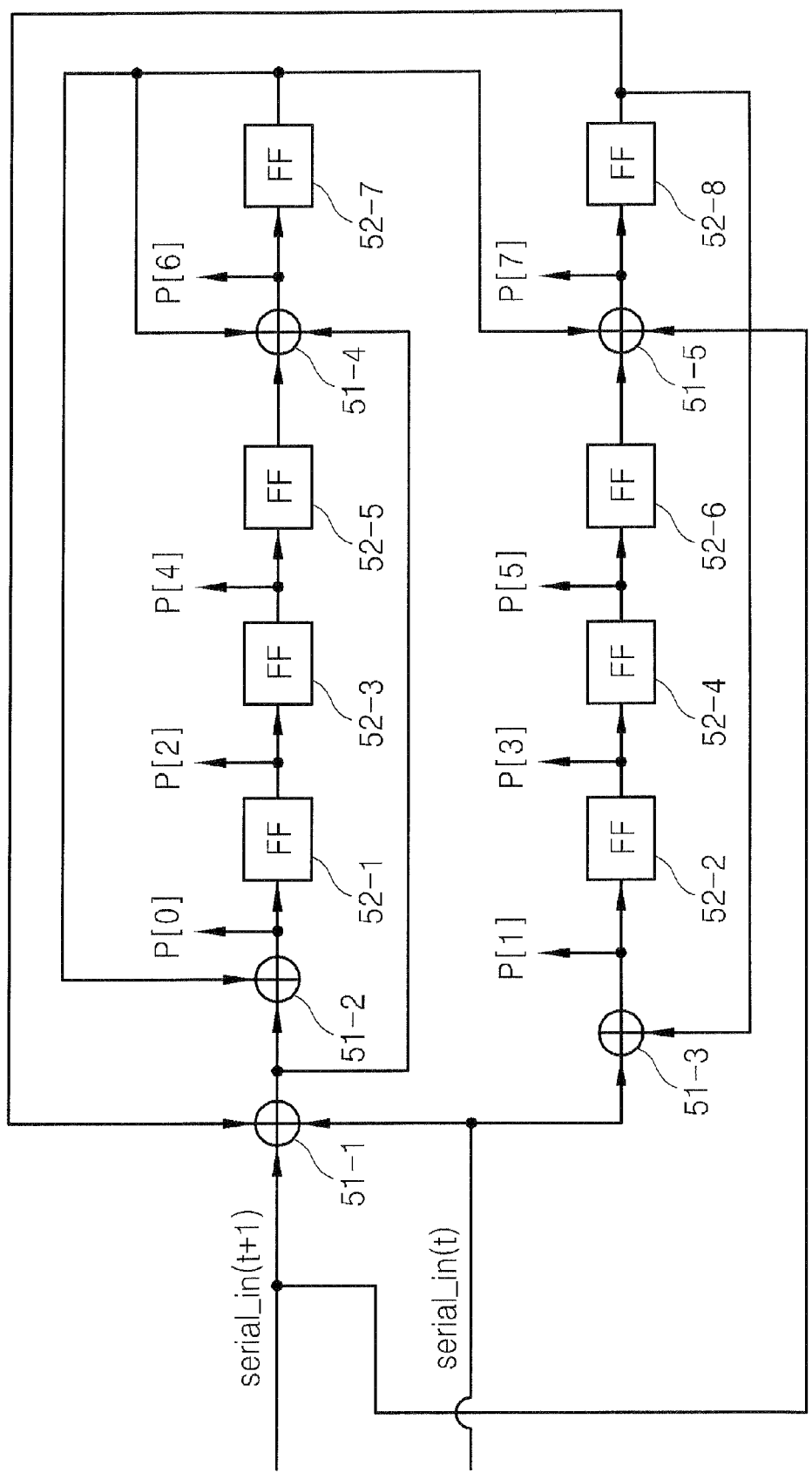
FIG. 3 is a circuit diagram of a cyclic redundancy check circuit configured according to an embodiment of the present invention.

FIG. 3 shows a CRC circuit according to an embodiment of the present invention. Referring to FIG. 3, the CRC circuit embodies and implements Equation 4. Thus, a CRC bit generation (polynomial) expression (Equation 1) is embodied in hardware with respect to the time that is delayed (here, t+1) relative to the input parallel data.

As shown in FIG. 3, the CRC circuit includes a plurality of modulo-2 adders 51-1 through 51-5 and a plurality of delay units (e.g., flip-flops) 52-1 through 52-8 for data delay.

The CRC circuit shown in FIG. 3 is described in further detail below. The CRC circuit of FIG. 3 generates and outputs first through eighth tap bits P[0] through P[7] that constitute the CRC bits. For this purpose, the CRC circuit includes the first through fifth exclusive logic sum operators 51-1 through 51-5 and the first through eighth delay units (e.g., flip-flops) 52-1 through 52-8.

The first exclusive logic sum operator 51-1 performs exclusive logic sum of the first and second channel data serial_in(t) and serial_in(t+1) and an eighth delay bit and outputs the exclusively logic summed data. The eighth delay bit is an output signal of the eighth delay unit (e.g., flip-flop) 52-8, that is, a delayed signal of the eighth tap bit P[7].

The second exclusive logic sum operator 51-2 performs exclusive logic sum of an output signal of the first exclusive logic sum operator 51-1 and a seventh delay bit to generate a first tap bit P[0]. The seventh delay bit is an output signal of the seventh flip-flop 52-7, that is, a delay signal of the seventh tap bit P[6].

The third exclusive logic sum operator 51-3 performs exclusive logic sum of the first channel data serial_in(t) and the eighth delay bit, that is, the output signal of the eighth flip-flop 52-8, to generate a second tap bit P[1].

The first flip-flop 52-1 delays the first tap bit P[0] to generate the third tap bit P[2]. The second flip-flop 52-2 delays the second tap bit P[1] to generate the fourth tap bit P[3]. The third flip-flop 52-3 delays the third tap bit P[2] to generate the fifth tap bit P[4]. The fourth flip-flop 52-4 delays the fourth tap bit P[3] to generate the sixth tap bit P[5]. The fifth flip-flop 52-5 delays the fifth tap bit P[4] to generate the fifth delay bit. The sixth flip-flop 52-6 delays the sixth tap bit P[5] to generate the sixth delay bit.

The fourth exclusive logic sum operator 51-4 performs exclusive logic sum of the output signal of the first exclusive logic sum operator 51-1, the fifth delay bit, and the seventh delay bit to generate the seventh tap bit P[6]. The fifth exclusive logic sum operator 51-5 performs exclusive logic sum of the sixth delay bit (the output signal of the sixth flip-flop 52-6), the seventh delay bit (the output signal of the seventh flip-flop 52-7), and the second channel data (serial_in(t+1)) to generate the eighth tap bit P[7].

Since the above calculation circuit architecture can be adapted to any given CRC polynomial and to all multi-channel serial communication systems, even as the number of data input in parallel increases, gate delay due to the modulo-2 adders increases while the calculation can be practically performed within an allowable range.

In the conventional mono-channel serial communication system, since the conventional CRC circuit has only one input, under a multichannel communication environment in which a plurality of inputs are simultaneously generated, data to be processed first is processed while the other data is stored and processed later, at a higher (serial) clock frequency. However, since data within each clock cycle is transmitted in parallel, the amount of data being stored increases as time passes so that the storage capacity of a data storing unit needs to be increased. Also, when the same clock as that used in the mono-channel serial communication environment is used for the multi-channel communication, the time to process data increases as much as the number of the multiple channels so that the CRC is processed quite later than a point when the data transmission is completed.

However, according to the architecture of the exemplary CRC circuit shown in FIG. 3, since the resultant expression obtained by first executing a mathematical calculation is embodied into a CRC circuit, the parallel processing of parallel inputs to the CRC circuit is made possible and the above-mentioned storage unit is not needed so that the size of the entire circuit is reduced and the time delay generated during communication can be reduced or removed.

While this invention has been particularly shown and described with reference to preferred embodiments thereof, it will be understood by those skilled in the art that various changes in form and details may be made therein without departing from the spirit and scope of the invention as defined by the appended claims.

As described above, according to the present invention, since a resultant expression obtained by first executing a mathematical calculation is embodied into a CRC circuit, the parallel processing of parallel inputs by a CRC circuit is made possible and a storage unit for storing the data input in parallel is not needed so that the size of the entire circuit is reduced and the time delay generated during communication can be removed. In the claims and the disclosure above, the term "modulo-2 adder" of course designates and means and includes its known alternatives and equivalents, such as a modulo-2 adder, a modulo-2 subtractor and an exclusive-OR (XOR) gate.

What is claimed is:

1. A cyclic redundancy check (CRC) circuit comprising:
a plurality of adders; and
a plurality of delay elements, the total number of the plurality of delay elements being k, k being an integer that is equal to or greater than three,
wherein the plurality of adders and the plurality of delay elements are configured to output CRC bits that satisfy a polynomial expression $P(x)=1+x^{k-2}+x^{k-1}+x^k$ based on receipt of a plurality of bits via a plurality of input terminals.

2. The CRC circuit of claim 1, wherein each of the plurality of delay elements is a flip-flop.

3. The CRC circuit of claim 2, wherein each flip flop outputs one of the CRC bits.

4. The CRC circuit of claim 1, wherein k is eight.

5. The CRC circuit of claim 1, further including a plurality of registers which receive the plurality of bits via the plurality of input terminals.

6. The CRC circuit of claim 5, further including a switching circuit having an input port to receive input data, wherein the switching circuit is connected to the plurality of input terminals.

7. The CRC circuit of claim 1, wherein the plurality of input terminals are connected to a plurality of channels.

8. The CRC circuit of claim 1, wherein the CRC bits includes a plurality of tap bits, the plurality of tap bits including a first tap bit, a second tap bit, a third tap bit, a fourth tap bit, a fifth tap bit, a sixth tap bit, a seventh tap bit and an eighth tap bit,
the plurality of adders and the plurality of delay elements are configured to generate the plurality of tap bits, the plurality of adders including a plurality of modulo-2 adders, the plurality of delay elements including a plurality of flip-flops,
the plurality of modulo-2 adders includes a first modulo-2 adder, a second modulo-2 adder, a third modulo-2 adder, a fourth modulo-2 adder, a fifth modulo-2 adder, a sixth modulo-2 adder, a seventh modulo-2 adder and an eighth modulo-2 adder,
the plurality of flip-flops includes a first flip-flop, a second flip-flop, a third flip-flop, a fourth flip-flop, a fifth flip-flop, a sixth flip-flop, a seventh flip-flop and an eighth flip-flop, and
the plurality of flip-flops are configured to delay the plurality of tap bits and generate a plurality of delay bits, the plurality of delay bits including a first delay bit, a second delay bit, a third delay bit, a fourth delay bit, a fifth delay bit, a sixth delay bit, a seventh delay bit and an eighth delay bit, the plurality of bits includes a first channel data and a second channel data, the seventh flip-flop is configured to delay the seventh tap bit and to generate the seventh delay bit, the eighth flip-flop is configured to delay the eighth tap bit and to generate the eighth delay bit, the first modulo-2 adder is configured to perform an Exclusive OR (XOR) operation of the first channel data, the second channel data and the eighth delay bit, a second modulo-2 adder configured to perform the XOR operation of an output of the first modulo-2 adder and the seventh delay bit, and to generate the first tap bit, a third modulo-2 adder configured to perform the XOR operation of the first channel data and the eighth delay bit, and to generate the second tap bit, the first flip-flop is configured to delay the first tap bit and to generate the third tap bit, the second flip-flop is configured to delay the second tap bit and to generate the fourth tap bit, the third flip-flop is configured to delay the third tap bit and to generate the fifth tap bit, the fourth flip-flop is configured to delay the fourth tap bit and generate the sixth tap bit, the fifth flip-flop is configured to delay the fifth tap bit and to generate the fifth delay bit, the sixth flip-flop is configured to delay the sixth tap bit and to generate the sixth delay bit, the fourth modulo-2 adder is configured to perform the XOR operation of the output of the first modulo-2 adder, the fifth delay bit and the seventh delay bit, and to generate the seventh tap bit, and the fifth modulo-2 adder is configured to perform the XOR of the sixth delay bit, the seventh delay bit and the second channel data, and to generate the eighth tap bit.

9. A receiving circuit for use in a multi-channel communication system, comprising:
a cyclic redundancy check (CRC) circuit including a plurality of adders and a plurality of delay elements, the total number of the plurality of delay elements being k, k being an integer that is equal to or greater than three; and
a determination portion including a receiver and a comparator, wherein the receiver is configured to receive first CRC bits from a multi-channel medium,
the plurality of adders and the plurality of delay elements are configured to output second CRC bits that satisfy a polynomial expression $P(x)=1+x^{k-2}+x^{k-1}+x^k$ based on receipt of a plurality of bits via a plurality of input terminals, and
the comparator is configured to determine an error by comparing at least one bit among the first CRC bits with at least one bit among the second CRC bits.

10. The receiving circuit of claim 9, further including M storing units configured to store M-bit data received from the multi-channel medium.

11. The receiving circuit of claim 10, further including an output portion configured to output the M-bit data serially.

12. The receiving circuit of claim 9, wherein the determination portion is configured to detect the error if the at least one bit of the first CRC bits is not equal to the at least one bit of the second CRC bits.

13. The receiving circuit of claim 9, wherein each of the plurality of delay elements is a flip flop, and each flip flop outputs one of the first or the second CRC bits.

14. The receiving circuit of claim 9, wherein k is eight.

15. The receiving circuit of claim 9, wherein the minimum number of the plurality of adders is 4.

16. The receiving circuit of claim 9, wherein data transmitted over the multi-channel is in accordance with an HDMI standard.

17. A transmitting circuit for use in a multi-channel communication system, comprising:
a cyclic redundancy check (CRC) circuit including a plurality of adders and a plurality of delay elements, the total number of the plurality of delay elements being k, k being an integer that is equal to or greater than three, the plurality of adders and the plurality of delay elements being configured to output CRC bits that satisfy a polynomial expression $P(x)=1+x^{k-2}+x^{k-1}+x^k$ based on receipt of a plurality of bits via a plurality of input terminals; and
a transmit portion configured to transmit over a multi-channel medium the CRC bits that are output from the CRC circuit.

18. The transmitting circuit of claim 17, further including a plurality of storing units configured to store N-bit serial data, N being an integer equal to or greater than two, wherein the plurality of storing units includes first and second storing units configured to alternately store the N-bit serial data.

19. The transmitting circuit of claim 18, wherein the transmit portion is further configured to selectively transmit the N-bit serial data that is output from the plurality of storing units or the CRC bits, the plurality of bits including the N-bit serial data and the CRC bits.

20. The transmitting circuit of claim 17, wherein each of the plurality of delay elements is a flip flop, and each flip flop outputs one of the CRC bits.

21. The transmitting circuit of claim 17, wherein k is eight.

22. The transmitting circuit of claim 17, wherein the transmit portion is further configured to transmit data over the multi-channel medium in accordance with an HDMI standard.

23. A multi-channel communication system, comprising:
a transmitting circuit including:
a first cyclic redundancy check (CRC) circuit including a plurality of first adders and a plurality of first delay elements, the total number of the plurality of first delay elements being k, k being an integer that is equal to or greater than three, the plurality of first adders and the plurality of first delay elements being configured to output first CRC bits that satisfy a first polynomial expression based on receipt of a plurality of first bits via a plurality of first input terminals; and
a transmit portion configured to transmit over a multi-channel medium the first CRC bits that are output from the first CRC circuit; and
a receiving circuit including. a second CRC circuit including a plurality of second adders and a plurality of second delay elements, the total number of the plurality of second delay elements being m, m being an integer that is equal to or greater than three, the plurality of second adders and the plurality of second delay elements being configured to output second CRC bits that satisfy a second polynomial expression $P(x)=1+x^{k-2}+x^{k-1}+x^k$ based on receipt of a plurality of second bits via a plurality of second input terminals; and
a determination portion including a receiver and a comparator, the receiver being configured to receive the first CRC bits from the multi-channel medium, the comparator being configured to determine an error by comparing at least one bit among the first CRC bits with at least one bit among the second CRC bits.

24. The system according to claim 23, wherein the first CRC circuit and the second CRC circuit are identical to each other.

25. The system of claim 23, wherein the transmitting circuit further includes a plurality of storing units configured to store N-bit serial data, N being an integer equal to or greater than two, wherein the plurality of storing units includes first and second storing units configured to alternately store the N-bit serial data.

26. The circuit of claim 25, wherein the transmit portion is further configured to selectively transmit the N-bit serial data that is output from the plurality of storing units or the CRC bits, the plurality of bits including the N-bit serial data and the CRC bits.

27. The system of claim 23, wherein each of the plurality of delay elements is a flip flop, and each flip flop outputs one of the first CRC bits and the second CRC bits.

28. The system of claim 23, wherein k is eight.

29. The system of claim 23, wherein the receiving circuit further includes M storing units configured to store M-bit data received from the multi-channel medium.

30. The system of claim 23, wherein the receiving circuit further includes an output portion configured to output the M-bit data serially.

31. A cyclic redundancy check (CRC) circuit comprising:
a plurality of adders; and
a plurality of delay elements, the total number of the plurality of delay elements being k, k being an integer that is equal to or greater than three,
wherein the plurality of adders and the plurality of delay elements are configured to output CRC bits that satisfy a polynomial expression $P(x)=1+x^{k-2}+x^{k-1}+x^k$ based on receipt of a plurality of bits via a plurality of input terminals,
the CRC bits includes a plurality of tap bits, the plurality of tap bits including a first tap bit, a second tap bit, a third tap bit, a fourth tap bit, a fifth tap bit, a sixth tap bit, a seventh tap bit and an eighth tap bit,
the plurality of adders and the plurality of delay elements are configured to generate the plurality of tap bits, the plurality of adders including a plurality of modulo-2 adders, the plurality of delay elements including a plurality of flip-flops,
the plurality of modulo-2 adders includes a first modulo-2 adder, a second modulo-2 adder, a third modulo-2 adder, a fourth modulo-2 adder, a fifth modulo-2 adder, a sixth modulo-2 adder, a seventh modulo-2 adder and an eighth modulo-2 adder,
the plurality of flip-flops includes a first flip-flop, a second flip-flop, a third flip-flop, a fourth flip-flop, a fifth flip-flop, a sixth flip-flop, a seventh flip-flop and an eighth flip-flop, and
the plurality of flip-flops are configured to delay the plurality of tap bits and generate a plurality of delay bits, the plurality of delay bits including a first delay bit, a second delay bit, a third delay bit, a fourth delay bit, a fifth delay bit, a sixth delay bit, a seventh delay bit and an eighth delay bit,
the plurality of bits includes a first channel data and a second channel data, the seventh flip-flop is configured to delay the seventh tap bit and to generate the seventh delay bit,
the eighth flip-flop is configured to delay the eighth tap bit and to generate the eighth delay bit,
the first modulo-2 adder is configured to perform an Exclusive OR (XOR) operation of the first channel data, the second channel data and the eighth delay bit,
a second modulo-2 adder configured to perform the XOR operation of an output of the first modulo-2 adder and the seventh delay bit, and to generate the first tap bit,
a third modulo-2 adder configured to perform the XOR operation of the first channel data and the eighth delay bit, and to generate the second tap bit,
the first flip-flop is configured to delay the first tap bit and to generate the third tap bit, the second flip-flop is configured to delay the second tap bit and to generate the fourth tap bit,
the third flip-flop is configured to delay the third tap bit and to generate the fifth tap bit,
the fourth flip-flop is configured to delay the fourth tap bit and generate the sixth tap bit,
the fifth flip-flop is configured to delay the fifth tap bit and to generate the fifth delay bit,
the sixth flip-flop is configured to delay the sixth tap bit and to generate the sixth delay bit,
the fourth modulo-2 adder is configured to perform the XOR operation of the output of the first modulo-2 adder, the fifth delay bit and the seventh delay bit, and to generate the seventh tap bit, and
the fifth modulo-2 adder is configured to perform the XOR of the sixth delay bit, the seventh delay bit and the second channel data, and to generate the eighth tap bit.

* * * * *